United States Patent [19]

Taguchi et al.

[11] Patent Number: 4,983,249

[45] Date of Patent: * Jan. 8, 1991

[54] METHOD FOR PRODUCING SEMICONDUCTIVE SINGLE CRYSTAL

[75] Inventors: Tsunemasa Taguchi, Suita; Hirokuni Nanba, Osaka, both of Japan

[73] Assignees: Production Engineering Association; Sumitomo Electric Industries, Ltd., both of Osaka, Japan

[ * ] Notice: The portion of the term of this patent subsequent to Sep. 12, 2006 has been disclaimed.

[21] Appl. No.: 322,200

[22] Filed: Mar. 9, 1989

[30] Foreign Application Priority Data

Mar. 11, 1988 [JP] Japan .................................. 63-57687

[51] Int. Cl.$^5$ ..................... C30G 1/08; C30G 1/10; C30G 23/02; C30G 29/48
[52] U.S. Cl. ................................. 156/603; 156/610; 156/612; 156/613; 156/DIG. 72; 156/DIG. 97
[58] Field of Search ............... 156/603, 610, 612, 613, 156/614, DIG. 77, DIG. 72, DIG. 73

[56] References Cited

U.S. PATENT DOCUMENTS

| | | | |
|---|---|---|---|
| 4,422,888 | 12/1983 | Stutius | 156/613 |
| 4,584,053 | 4/1986 | Namba et al. | 156/DIG. 73 |
| 4,632,711 | 12/1986 | Fujita et al. | 156/613 |
| 4,866,007 | 9/1989 | Taguchi et al. | 437/108 |

OTHER PUBLICATIONS

Chemical Abstracts, G. Dervyatykh et al. "Properties of Epitaxial Layers of Zinc Selenide Precipitated from Diethylzinc and Hydrogen Selenide", Apr. 30, 1984, p. 550.

Journal of Crystal Growth, T. Yodo et al., "Growth of High-Quality ZnSe by MOVPE on (100) ZnSe Substrate", Jan. 1, 1988, p. 274.

Japanese Journal of Applied Physics, A. Yoshikawa et al., "Effects of (H2Se)/(DMZn) Molar Ratio on Epitaxial ZnSe Films Grown by Low-Pressure MOCVD", Oct. 1984, pp. L773-L775.

Primary Examiner—Gary P. Straub
Attorney, Agent, or Firm—Cushman, Darby and Cushman

[57] ABSTRACT

A n-type ZnSe thin layer is prepared by heating a ZnSe signal crystal substrate in a hydrogen atmosphere under a pressure of from 0.1 Torr. to 10 Torr. at a temperature of from 250° C. to 450° C. while supplying a gaseous organozinc compound, H$_2$Se gas and a gaseous organoaluminum compound in such amounts that a molar ratio of Se/Zn is from 10 to 100 and a molar ratio of Al/Zn is from 0.02 to 0.07 to grow the aluminum-doped ZnSe thin film on the ZnSe single crystal substrate.

1 Claim, 4 Drawing Sheets

METHOD FOR PRODUCING SEMICONDUCTIVE SINGLE CRYSTAL

BACKGROUND OF THE INVENTION

1. Field of the Invention

The present invention relates to a method for producing a semiconductive single crystal. More particularly, the present invention relates to a method for producing a thin film of aluminum-doped ZnSe single crystal which is epitaxially grown on a ZnSe single crystal substrate by the MOCVD method.

2. Description of the Related Art

Presently, LEDs for emitting infrared, red, orange, yellow and green light are available. However, none of the practically used LEDs can emit blue light. To emit the blue light, a band gap should be larger than 2.5 eV.

Hitherto, many materials such as GaN, SiC and GaAlN have been proposed as materials of the blue light emitting LED. However, none of these materials has been able to provide a practically usable blue light emitting LED.

Since ZnSe has a band gap of 2.7 eV which is a direct transition type, it is one of promising materials of the blue light emitting LED. However, many problems should be solved before ZnSe is used as the material of the blue light emitting LED.

To produce LED, a p-n junction should be formed. To this end, a p-type thin film should be formed on a n-type substrate with low resistance, or a n-type thin film should be formed on a p-type substrate with low resistance. However, the ZnSe crystal as such is an n-type semiconductive material with high resistance. For example, the ZnSe crystal has resistivity of $10^8$ ohm.cm to $10^9$ ohm.cm. Therefore, the ZnSe crystal as such cannot be used as the substrate of LED.

Then, it is proposed to convert a bulk single crystal of ZnSe to the n-type one with low resistance through doping the ZnSe single crystal with impurities.

In addition, to form the p-n junction, the p-type film is also required. However, it was believed that any p-type ZnSe could be prepared.

Recently, the growth of the p-type ZnSe through Li-doping was reported by J. Nishizawa et al, "Blue Light Emission from ZnSe p-n Junctions", J. Appl. Phys., 57 (6), 2210-2216 (1985). But, the reported method has unsatisfactory reproducibility and the p-type ZnSe cannot be obtained easily.

The most fundamental problem resides in the production of a ZnSe bulk single crystal. Namely, a large ZnSe bulk single crystal with high purity has not been produced.

Since ZnSe is easily sublimated, it cannot be melted by simply heating it under atmospheric or moderate pressure. However, it can be melted under high pressure of about 80 atm. or higher. The melting point of ZnSe is reported to be about 1,520° C., but this melting point is measured under such high pressure.

To produce the ZnSe single crystal, many methods such as a high pressure melting method, an iodine transporting method, a solution growth method, a sublimation method and the Piper method have been attempted. The first two methods can produce a comparatively large single crystal although the singly crystal contains a large amount of impurities and has many defects. The latter three methods produce a small single crystal, so that they are not practically applied. Further, the single crystal produced by these three methods has insufficient purity.

Since a large ZnSe single crystal with good quality cannot be produced by those conventional methods, many attempts have been made to epitaxially grow the n-type ZnSe thin layer on a GaAs substrate. Since the technique for growing the GaAs single crystal has been established, a large GaAs single crystal having less defects can be grown. Fortunately, difference of the lattice constants between GaAs and ZnSe is small.

The epitaxial growth of ZnSe/GaAs is disclosed by, for example, W. Stutivs, Appl. Phys. Lett., Vol. 38 (1981) 352 and K. Ohkawa et al, J. Appl. Phys. Vol. 62 (1987) 3216.

However, since the ZnSe/GaAs junction is a junction between the different materials, it has some drawbacks such as follows:

1. Although the lattice constants of both materials are close at room temperature, they have different coefficients of thermal expansion. Since the ZnSe film is grown on the GaAs substrate is at high temperature and cooled to room temperature, stress is generated in the thin film due to the difference of coefficients of thermal expansion between the two materials. Since the stress is surprisingly large, deterioration caused by stress leads to unsatisfactory electrical characteristics.

2. The impurities migrate from the substrate. For example, Ga atoms migrate from the substrate into the ZnSe thin film to form n-type impurities. Depending on the degree of migration, a carrier concentration varies.

These drawbacks are common to the heteroepitaxy.

To overcome these drawbacks, it may be contemplated to grow ZnSe on the ZnSe substrate. Hitherto, no ZnSe single crystal with good quality could have been obtained. Only one paper, namely P. Blaconnier et al, J. Appl. Phys. Vol. 52 (1981) 6895 reported the ZnSe/ZnSe epitaxy. Blaconnier et al grew the ZnSe thin film on the ZnSe substrate by the iodine transporting method or the Piper method. According to Blaconnier et al, the ZnSe thin film formed by the iodine transporting method contains many iodine atoms as impurities. In the photoluminescence measurement, strong emission due to excitons constrained with neutral donor impurities is observed. This is due to the presence of the iodine atoms. The contamination with the iodine atoms is an expected consequence since the iodine transporting method utilizes the following reaction:

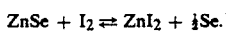

The Piper method is one of the sublimation methods. The ZnSe thin film grown by this method has a strong emission line from excitons constrained with deep neutral acceptors. According to Blaconnier et al, the ZnSe thin film was formed by the MOCVD method using dimethylzinc [Zn(CH₃)₂] and H₂Se as raw materials at the substrate temperature of 500° C. The ZnSe thin film formed on the ZnSe substrate had a strong emission line from excitons constrained with the neutral donors. This can be attributed to the Ga atoms, which generated a deep donor impurity level. Blaconnier et al assumed that Ga might be contained in dimethylzinc. Although they did not intend to dope the impurities in the ZnSe single crystal, the Ga atoms were accidentally contained as the impurity.

In the prior arts, no report has been made on the epitaxial growth of a thin film of ZnSe doped with the n-type impurity on the ZnSe substrate.

SUMMARY OF THE INVENTION

An object of the present invention is to provide a method for epitaxially growing an aluminum-doped ZnSe thin film on a ZnSe single crystal.

Accordingly, the present invention provides a method for growing an aluminum-doped ZnSe thin film on a ZnSe single crystal substrate, which comprises heating the ZnSe single crystal substrate in a hydrogen atmosphere under a pressure of from 0.1 Torr. to 10 Torr. at a temperature of from 250° C. to 450° C. while supplying a gaseous organozinc compound, H₂Se gas and a gaseous organoaluminum compound in such amounts that a molar ratio of Se/Zn is from 10 to 100 and a molar ratio of Al/Zn is from 0.02 to 0.07 to grow the aluminum-doped ZnSe thin film on the ZnSe single crystal substrate.

Preferably, the ZnSe single crystal substrate is prepared by a method comprising steps of placing a piece of a ZnSe polycrystal in a sealed reactor tube having an atmosphere of at least one gas selected from the group consisting of an inert gas, nitrogen and H₂Se kept at pressure of from 0.1 Torr. to 100 Torr., moving the reactor tube containing the piece of ZnSe polycrystal through a low temperature first zone kept at a temperature of from room temperature to 100° C., a temperature-raising second zone having a temperature gradient of from 50° C./cm to 200° C./cm, a high temperature third zone kept at a temperature of from 700° C. to 900° C., a temperature-lowering fourth zone having a temperature gradient of from −200° C./cm to −50° C./cm and a low temperature fifth zone kept at a temperature of from room temperature to 100° C. in this order at a moving rate of from 0.05 mm/day to 5 mm/day while keeping the solid state of the ZnSe material whereby the ZnSe polycrystal is converted to a ZnSe single crystal, and cutting the ZnSe single crystal to form the ZnSe substrate.

DETAILED DESCRIPTION OF THE DRAWINGS

The present invention should be clearly distinguished from the method of Blaconnier et al described above in the following points:

1. In the method of Blaconnier et al, the ZnSe thin film was of n-type through the accidental Ga doping, while according to the present invention, aluminum is intentionally doped as the n-type dopant. Although Ga and Al are both n-type impurities, they have big differences. For example, Ga generates a deep donor level so that the electron constrained with the donor cannot be easily raised to a conduction band. That is, at the higher temperature, the electrons can hardly provide free carriers. On the contrary, Al generates a comparatively shallow donor level. Therefore, the electron of aluminum can be easily shifted up to the conduction band, namely aluminum can easily provide a free electron. This achieve the purpose to lower the resistance.

The carrier concentration, namely the electron concentration, increases in proportion to the donor concentration. This is true for the shallow donor level. In case of the deep donor level, the free carriers cannot be provided unless the temperature is raised to considerably high.

2. Another difference is the possibility to control the carrier concentration. Blaconnier et al tried to produce the non-doped ZnSe thin film but Ga was accidentally doped. Such is not suitable for the industrial application. Since a desired range of resistivity is determined beforehand, the amount of the dopant should be controlled to achieve this range.

According to the present invention, the aluminum-doped ZnSe thin film is formed on the ZnSe substrate by the MOCVD method. One of the characteristics of the present invention resides in the substrate. Without the large area substrate having high purity, ZnSe cannot be epitaxially grown on the substrate.

The preferred method for the production of the ZnSe single crystal is described in Japanese Pat. Kokai Publication No. 230599/1988 (Pat. Application No. 65389/1987 filed on Mar. 18, 1987). This method will be illustrated with making reference to FIG. 4.

The ZnSe polycrystal having a suitable size can be produced by the conventional CVD or sintering method. From the polycrystal bulk, a rod is cut out.

The polycrystal rod is placed in a reaction tube, for example a quartz capsule. Then, the tube is filled with at least one gas selected from the group consisting of an inert gas, nitrogen and H₂Se, and sealed. The amount of the gas is so adjusted that the inner pressure reaches 0.1 Torr. to 100 Torr. during heating.

Figure 4:
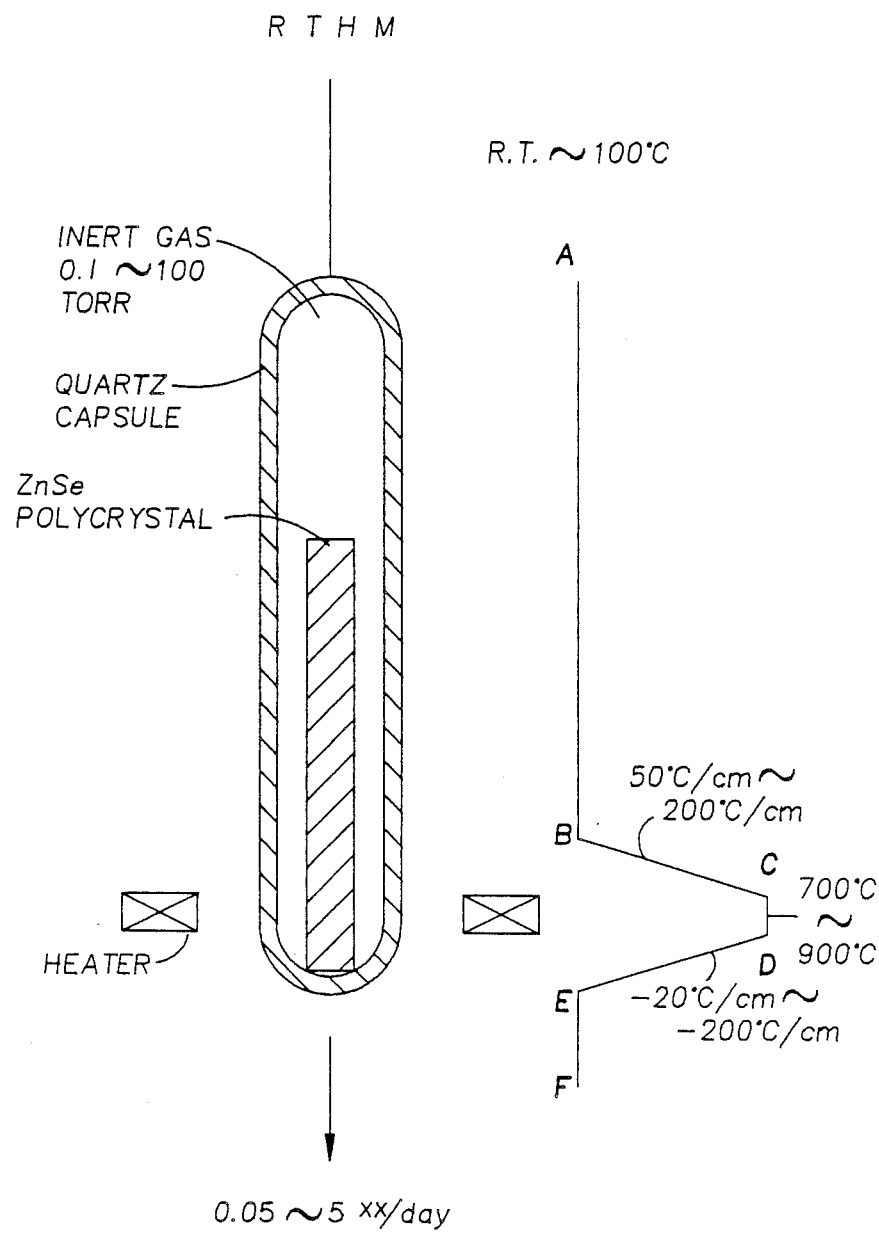

Then, the reactor tube is heated. The temperature distribution to be achieved by a heater is shown in FIG. 4 by the line A-B-C-D-E-F.

A low temperature first zone corresponding to the line A-B is kept at a temperature of from room temperature to 100° C. A temperature-raising second zone corresponding the line B-C has a temperature gradient of from 50° C./cm to 200° C./cm. A high temperature third zone corresponding to the line C-D is kept at a temperature of from 700° C. to 900° C. The length of the third zone (C-D) is made as short as possible, for example 5 mm to 20 mm. A temperature-lowering fourth zone corresponding to the line D-E has a temperature gradient of from −200° C./cm to −50° C./cm. Finally, a low temperature fifth zone corresponding to the line E-F is kept at a temperature of from room temperature 100° C. The reactor tube is passed from the first zone to the fifth zone at a rate of from 0.05 mm/day to 5 mm/day while keeping the solid state of the ZnSe material. Since only the zone C-D is kept at the high temperature, the ZnSe polycrystal is converted to a ZnSe single crystal. The temperature is not higher than 900° C. even in the high temperature third zone, ZnSe is not sublimated and keeps the solid state. In FIG. 4, the zones are vertically arranged, although they may be horizontally or slantwise arranged.

Preferably, the ZnSe polycrystal is of a thin long rod, since a very limited part should be locally heated. For example the rod has a diameter of from 3 to 30 mm.

Since the crystal is moved relatively to the heater, this method is a kind of the traveling heater methods. Since the polycrystal is converted to the single crystal through rotation of crystalline grains, this method is in the category of recrystallization. Then, the above method for converting the polycrystal to the single crystal can be named as "Recrystallization Traveling Heater Method (RTHM)".

Another characteristic of the present invention resides in the molar ratio of aluminum to zinc (Al/Zn). Aluminum is doped to generate the shallow donor level so that as many as possible electrons are present in the crystal as the free carriers and in turn the resistivity is decreased.

In case of silicon (Si), B, P or As is doped to produce the p- or n-type one. In this case, the carrier density is exactly proportional to the amount of the impurity. As the doping amount increases, the free carrier density increases and the electrical resistance decreases. In case of GaAs, such relation can be established.

However, when aluminum is doped in the ZnSe thin film, the carrier concentration is not simply proportional to the amount of the dopant. Then, the amount of aluminum to be doped should be controlled. According to the present invention, the molar ratio of Al to Zn is from 0.02 to 0.07.

Now, the method of the present invention will be explained in detail.

As the substrate, a wafer of the ZnSe single crystal which is preferably produced by the above described RTHM is used. Any plane of the single crystal may be used. For example, the (100), (110) or (111) plane can be used, although other planes can be used.

The temperature of the substrate is usually from 250° C. to 450° C., preferably from 300° C to 400° C.

As the zinc source, any of organozinc compounds may be used. Preferred examples of the organozinc compounds are dimethylzinc [$Zn(CH_3)_2$] and diethylzinc [$Zn(C_2H_5)_2$].

As the selenium source, $H_2Se$ is used.

As the aluminum source, any of organoaluminum compounds may be used. Preferred examples of the organoaluminum compounds are trimethylaluminum [$Al(CH_3)_3$] and triethylaluminum [$Al(C_2H_5)_3$] are preferably used.

To obtain the epitaxially grown film with good quality, the molar ratio of selenium to zinc (Se/Zn) is from 10 to 100.

Figure 1:
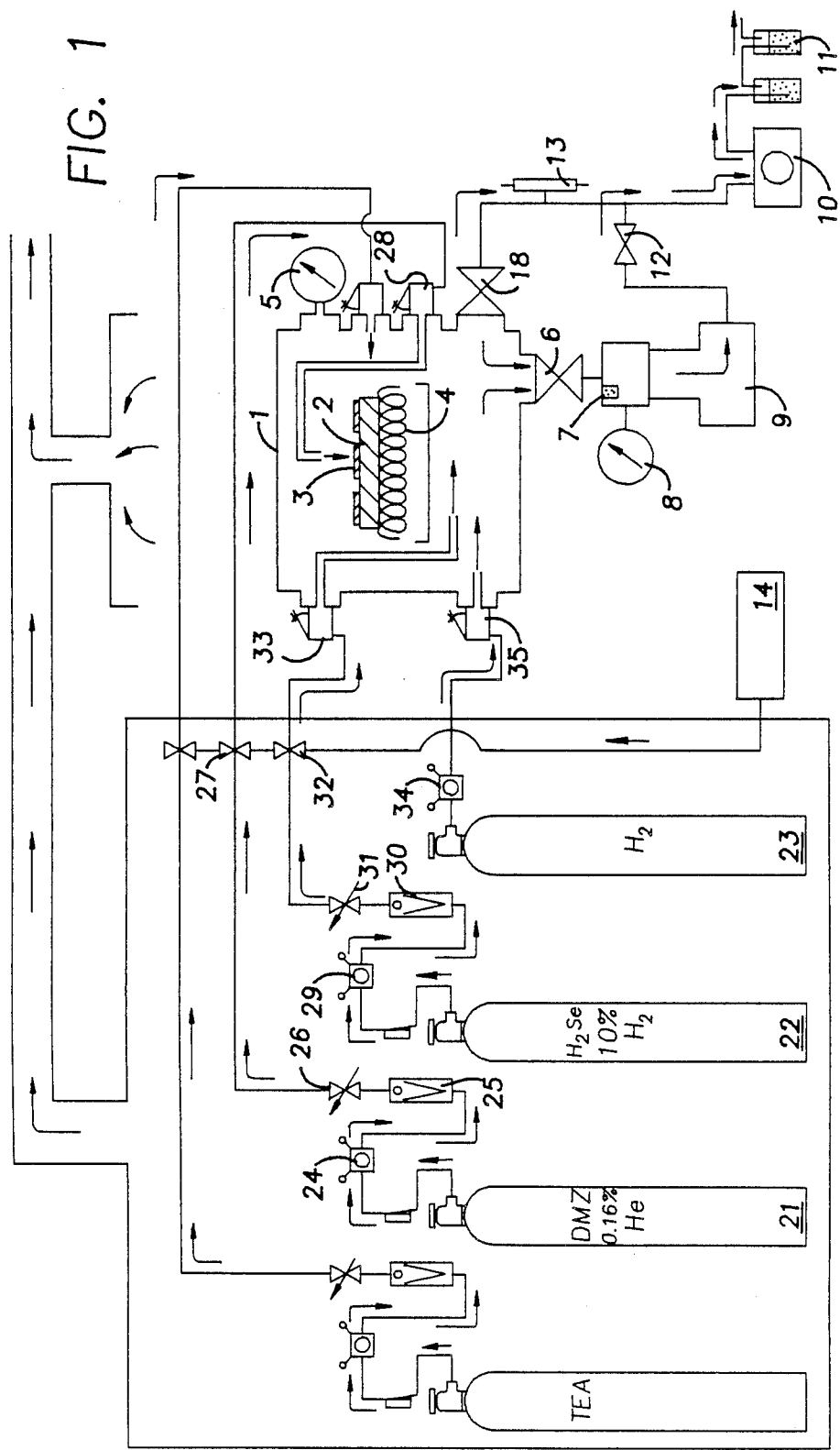
FIG. 1 schematically shows an apparatus for carrying out the method of the present invention.

By making reference to FIG. 1, the MOCVD apparatus for carrying out the method of the present invention will be illustrated. In FIG. 1, the apparatus is placed horizontally, although a vertically arranged apparatus can be used in the present invention. Since the MOCVD apparatus is well known in the art, it will be briefly explained.

A CVD furnace 1 consists of a vessel which can be evacuated. In the furnace 1, a suscepter 2 is installed. On the suscepter 2, a ZnSe substrate 3 is horizontally placed, and below the suscepter 2, a heater 4 is arranged. By the heater 4, the suscepter 2 and then the substrate 3 are heated at a desired temperature.

The furnace 1 is evacuated with a rotary pump 10 and further with an oil diffusion pump through a main valve 6 and a trap 7 cooled with liquid nitrogen. With a vacuum gauge 5, a degree of high vacuum in the furnace 1 is monitored. A trap 11 is used to remove the impurities and the like. The degree of vacuum during evacuating the furnace 1 with the rotary pump 10 is roughly indicated by a Geissler tube 13.

Cylinders 21, 22 and 23 contain helium gas containing 0.16% of dimethylzinc, hydrogen gas containing 10% of $H_2Se$ and pure hydrogen gas, respectively. The pure hydrogen gas is used as an atmospheric gas to keep the pressure in the furnace from 0.1 Torr to 10 Torr. The dimethylzinc-containing helium is supplied into the CVD furnace 1 from a gas inlet 28 through a regulator 24, a mass-flow controller 25, a cutting valve 26 and a valve 27. The $H_2Se$-containing hydrogen gas and triethylaluminum gas are supplied into the CVD furnace 1 in the similar way.

As already described, the substrate temperature is adjusted at a temperature of from 250° C. to 450° C., the Al/Zn ratio and the Se/Zn ratio are controlled to be from 0.02 to 0.07 and from 10 to 100, respectively.

Under the above conditions, the aluminum-doped ZnSe thin film is formed on the substrate through the gas phase reaction.

The thickness of the aluminum-doped ZnSe thin film can be adjusted by the reaction time. Usually, the thickness is from 0.001 to 10 $\mu$m, preferably from 0.01 to 1 $\mu$m.

PREFERRED EMBODIMENTS OF THE INVENTION

The present invention will be illustrated further in detail by following Examples.

EXAMPLE

From the ZnSe single crystal mass produced by the RTHM method, a wafer having the (110) plane on the surface was cut out and etched with a boiling 25% aqueous solution of sodium hydroxide. Then, the wafer was treated in a hydrogen stream under several ten Torr. at 500° C. for several minutes to clean the surface.

As the zinc source, the helium gas containing 0.16% of dimethylzinc was used. As the selenium source, the hydrogen gas containing 10% of $H_2Se$ was used. As the aluminum source, triethylaluminum was used.

After evacuating the CVD furnace to $10^{-7}$ Torr., ZnSe was grown on the wafer surface under following conditions:

| | |
|---|---|
| Substrate | ZnSe (110) |
| Substrate temperature | 300–350° C. |
| Flow rate of dimethylzinc | $5.85 \times 10^{-6}$ mol/min. |
| Flow rate of $H_2Se$ | $1.44 \times 10^{-4}$ mol/min. |
| Flow rate of trimethylaluminum | $6.10 \times 10^{-8}$ to $4.07 \times 10^{-7}$ mol/min. |
| Se/Zn molar ratio | 24.6:1 |
| Total pressure | 3.0 Torr. |

The reason why the flow rate of trimethylaluminum was varied is to find the optimum flow rate.

Figure 2:
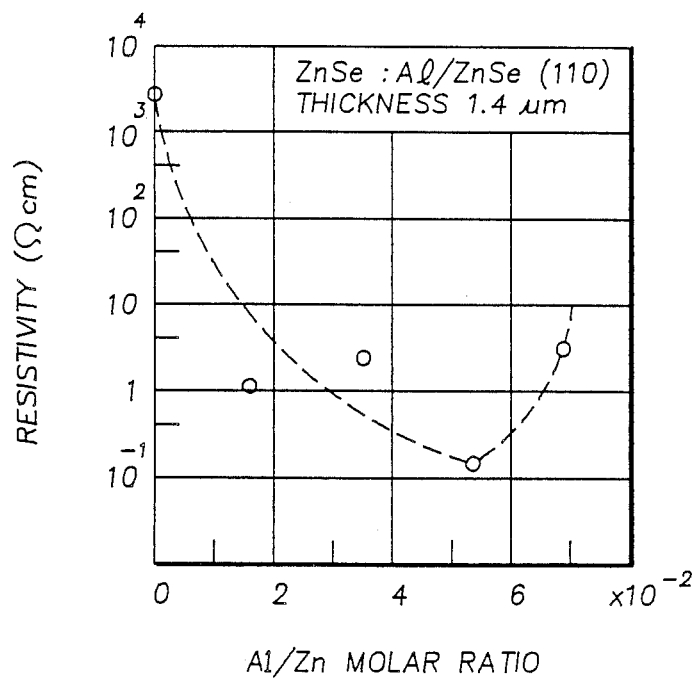
FIG. 2 is a graph showing a relationship between resistivity and the Al/Zn molar ratio when the ZnSe thin layer is grown on the ZnSe single crystal substrate according to the present invention.

FIG. 2 shows the relationship between the resistivity (ohm.cm) of the grown ZnSe thin film having a thickness of 1.4 $\mu$m and the Al/Zn molar ratio. The resistivity of the substrate was $10^8$ ohm.cm. When the doped amount of aluminum was zero (0), the resistivity of the ZnSe thin film was about $3 \times 10^3$ ohm.cm. This resistivity might be due to the presence of aluminum which may be contained in the zinc source gas or liberated from the wall of the furnace and accidentally doped.

As the supplied amount of aluminum is increased, the resistivity decreased. At the Al/Zn molar ratio of about $5.1 \times 10^{-2}$, the resistivity decreased to the minimum value of about $10^{-1}$ ohm cm. In this case, the carrier concentration was 10 cm$^2$/V.sec. As the supplied amount of aluminum is further increased, the resistivity increases. The reason for such increase of resistivity has not been clarified.

From the above results, it is understood that the resistivity of the ZnSe thin film is made lower than 10 ohm.cm when the Al/Zn molar ratio is in the range from 0.02 to 0.07.

Figure 3:
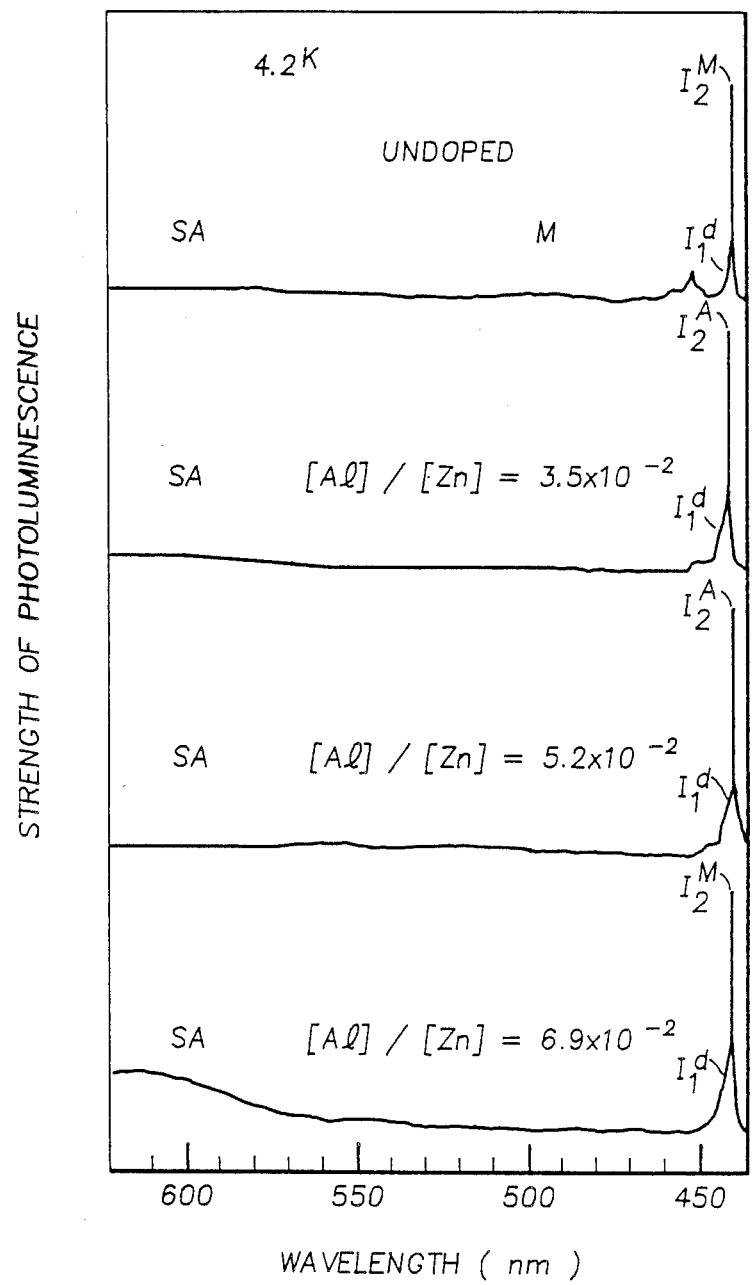
FIG. 3 shows the results of photoluminescence of the ZnSe thin layer when the Al/Zn molar ratio is 0, 0.035, 0.052 or 0.069, and FIG. 4 schematically shows the RTHM (Recrystallization Traveling Heater Method) for producing the ZnSe single crystal substrate.

FIG. 3 shows the results of photoluminescence measurement of the epitaxially grown ZnSe thin films. The photoluminescence measurement was carried out by exciting the thin layer with the He-Cd laser, splitting the luminescence light and measuring the intensity of said light at 4.2K. FIG. 3 includes the results for the Al/Zn molar ratios of 0 (zero), $3.5 \times 10^{-2}$, $5.2 \times 10^{-2}$ and $6.9 \times 10^{-2}$.

The peaks indicated as "$I_2^4$" correspond to the emission from the excitons constrained with the neutral donor impurities. Even in case of the undoped ZnSe film, this peak was observed since aluminum was accidentally doped.

The wavelength at which the $I_2^4$ peak is observed is the same for all the aluminum concentrations. At the Al/Zn molar ratio of $6.9 \times 10^{-2}$, the SA emission was strong. This phenomenon corresponds to the turbulence of the sites at which the aluminum atoms were introduced or increase of the number of vacant lattices of zinc.

According to the present invention, the thin film of the n-type ZnSe single crystal is formed by epitaxially growing the aluminum-doped ZnSe thin film on the ZnSe substrate. Thereby, the n-type ZnSe thin film having the resistivity of as low as $10^{-1}$ ohm.cm and the electron concentration of as high as $10^{18}$ cm$^{-3}$ can be produced.

Since the ZnSe thin film is homoepitaxially formed, it does not suffer from stress due to the difference of thermal expansion between the substrate and the thin film or the problems caused by the impurities which migrate from the substrate to the thin film.

The ZnSe thin film can be used as an n-type layer in the blue light-emitting diode.

What is claimed is:

1. A method for growing a ZnSe single crystal substrate comprising the steps of:
    a) placing a portion of a ZnSe polycrystal in a sealed reactor tube containing at least one gas selected from the group consisting of an inert gas, nitrogen and H$_2$Se and maintained at pressure of 0.1 Torr. to 100 Torr., Taguchi et al., Ser. No. 07/322,200
    b) moving the reactor tube containing the ZnSe polycrystal through
        i) a low temperature first zone maintained at a temperature from room temperature to 100° C./cm,
        ii) a temperature-raising second zone having a temperature gradient from 50° C./cm to 200° C./cm,
        iii) a high temperature third zone maintained at a temperature from 700° C. to 900° C.,
        wherein the temperature of the temperature of the temperature-raising second zone does not exceed the temperature of the high temperature third zone,
        iv) a temperature-lowering fourth zone having a temperature gradient from $-200°$ C./cm to $-50°$ C./cm and
        v) a low temperature fifth zone maintained at a temperature from room temperature to 100° C. in this order at a rate of 0.05 mm/day to 5 mm/day while maintaining the solid state of the substrate wherein ZnSe polycrystal is converted to ZnSe single crystal, and
        vi) cutting the ZnSe single crystal to form the ZnSe single crystal substrate.

* * * * *